(12) United States Patent
Radens et al.

(10) Patent No.: US 6,251,710 B1
(45) Date of Patent: Jun. 26, 2001

(54) METHOD OF MAKING A DUAL DAMASCENE ANTI-FUSE WITH VIA BEFORE WIRE

(75) Inventors: Carl J. Radens, LaGrangeville; Axel C. Brintzinger, Fishkill, both of NY (US)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/560,072

(22) Filed: Apr. 27, 2000

(51) Int. Cl.$^7$ .................................................. H01L 21/82
(52) U.S. Cl. ............................................ 438/131; 438/600
(58) Field of Search ................................... 438/131, 600, 438/637, 638

(56) References Cited

U.S. PATENT DOCUMENTS

| | | | |
|---|---|---|---|
| 5,602,053 | * | 2/1997 | Zheng et al. .......................... 438/131 |
| 5,705,849 | * | 1/1998 | Zheng et al. .......................... 257/530 |
| 6,025,226 | * | 2/2000 | Gambino et al. ..................... 438/600 |
| 6,034,882 | * | 3/2000 | Johnson et al. ...................... 365/103 |
| 6,081,021 | * | 6/2000 | Gambino et al. ..................... 257/530 |
| 6,110,826 | * | 8/2000 | Lou et al. ............................. 438/674 |
| 6,124,194 | * | 9/2000 | Shao et al. ........................... 438/600 |
| 6,166,423 | * | 12/2000 | Gambino et al. ..................... 257/532 |

* cited by examiner

Primary Examiner—John F. Niebling
Assistant Examiner—Lynne A. Gurley
(74) Attorney, Agent, or Firm—Steven Capella; Scully, Scott, Murphy and Presser

(57) ABSTRACT

An interconnect structure in which a patterned anti-fuse material is formed therein comprising: a substrate having a first level of electrically conductive features; a patterned anti-fuse material formed on said substrate, wherein said patterned anti-fuse material includes an opening to at least one of said first level of electrically conductive features; a patterned interlevel dielectric material formed on said patterned anti-fuse material, wherein said patterned interlevel dielectric includes vias, as least one of said vias includes a via space; and a second level of electrically conductive features formed in said vias and via spaces.

21 Claims, 4 Drawing Sheets

METHOD OF MAKING A DUAL DAMASCENE ANTI-FUSE WITH VIA BEFORE WIRE

FIELD OF THE INVENTION

The present invention relates to interconnect structures, and more particularly to interconnect structures such as anti-fuse structures in which an anti-fuse dielectric material is formed in the structure prior to formation of the vias and wires.

BACKGROUND OF THE INVENTION

The manufacture of integrated circuits (ICs) typically includes the formation of metallization layers which are patterned to provide interconnection between devices. Some IC interconnections are programable, either with fuses or anti-fuses. Unprogrammed fuses provide a low resistance link between or within metallization layers which can be programmed by being blown. That is, the fuse can be caused to be non-conductive by applying a sufficiently high current across it to blow.

Anti-fuses operate in the opposite fashion, i.e., the unprogrammed structure used to form the anti-fuse has an intrinsically high resistance, and the programmed structure has a relatively low resistance. By applying a programmable current, the electrical resistance through the anti-fuse material is greatly reduced providing a conductive link between or within metallization levels. Typical prior art anti-fuse materials include: amorphous silicon, amorphous carbon, carbon, germanium, selenium, compound semiconductors such as GaAs, SiC, AlP, InSb and CdTe, and ceramics such as $Al_2O_3$.

One prior art anti-fuse structure is shown in FIG. 1. Specifically, the structure shown in FIG. 1 comprises a substrate 12 such as a Si wafer. An oxide layer 14 overlays the substrate, and can be formed by a variety of well known deposition processes such as chemical vapor deposition. A metal layer 16 is then formed on the oxide layer utilizing conventional deposition processes such as evaporation or sputtering. A second oxide layer 18 is formed over the metal layer and a via 20 is formed in the second oxide layer utilizing conventional lithography and reactive-ion etching (RIE). One of the above mentioned anti-fuse materials is then formed in the via to form an anti-fuse structure 22. A second metal layer 24 is then formed over the structure.

Programming of the anti-fuse structure of FIG. 1 can be accomplished by providing a voltage of 4–10 volts between the metal layers. Before programming, the anti-fuse structure typically has a resistance of above 1 giga-ohm for a 1 $\mu$m diameter via. A programmed anti-fuse forms a conductive path 26 between the metal layers having a resistance of about 20–100 ohms.

Anti-fuse structures allow for much higher programable interconnection densities than standard fuse structures as well as smaller current and power for the non-programmed elements. A major problem with prior art anti-fuse structures is that dedicated lithographic masking levels are required to fabricate the same. Not only does the use of such dedicated lithographic masking levels add additional cost to the overall process, but it adds to the complexity of the same.

In view of the above mentioned problems with prior art anti-fuse structures, there is a continued need to develop a new and improved method in which an anti-fuse structure is fabricated without employing dedicated lithographic masking levels.

Co-assigned U.S. application Ser. No. 09/469,374, filed Dec. 22, 1999, describes one method of forming an interconnect structure wherein dedicated masking levels are not employed. In the '374 application, an interlevel dielectric (ILD) layer is formed on top of a substrate having a first level of electrically conductive features formed therein and then vias, at least one via being a slot via, are formed in the ILD layer to expose portions of the first level of electrically conductive features. Next, a conformal anti-fuse material is formed on the ILD and the anti-fuse material is patterned to form spaces in which a second level of electrically conductive features is formed. Etching is conducted to remove anti-fuse material from the spaces and the vacant spaces are then filled with a conductive material.

Alternative methods to the one disclosed in the '374 application are continuously being sought in which fewer processing steps are employed. The present invention describes an alternative method to the method disclosed in the '374 application and it represents an improvement since the anti-fuse material is formed on the surface of the substrate prior to ILD deposition. This eliminates extra processing steps required in the '374 application to create a standard contact; therefore the impact and/or influence on the contact itself is greatly minimized.

SUMMARY OF THE INVENTION

One object of the present invention is to provide a method of fabricating an interconnect structure in which an anti-fuse material is formed in the structure without the need of employing dedicated lithographic masking levels.

Another object of the present invention is to provide a method in which the anti-fuse material is formed on the surface of a substrate prior to forming vias in an interlevel dielectric layer of an interconnect structure.

A still further object of the present invention is to provide a method in which an anti-reflective coating is employed as the anti-fuse material.

A yet further object of the present invention is to provide a method which is simpler than existing prior art methods, yet is capable of creating a standard contact in which the impact on the contact has been significantly minimized.

These and other objects and advantages are achieved in the present invention by employing the following method which includes the steps of:

(a) forming an anti-fuse dielectric layer on a surface of a substrate, said substrate having a first level of electrically conductive features;

(b) forming an interlevel dielectric layer on said anti-fuse dielectric layer;

(c) forming vias in said interlevel dielectric layer exposing portions of said anti-fuse dielectric layer that overlay said first level of electrically conductive features;

(d) forming a wire level mask on said interlevel dielectric layer, wherein at least of one of said vias and a portion of said interlevel dielectric layer are left exposed;

(e) etching exposed portions of said anti-fuse dielectric layer from said exposed vias, wherein during said etching a portion of said exposed interlevel dielectric layer is removed so as to form a space wherein a second level of electrically conductive features will be subsequently formed;

(f) stripping said wire level mask; and (g) filling said vias including said spaces with a conductive material, whereby said second level of electrically conductive features is formed.

An optional planarization step may follow filling step (g). Moreover, a multilevel interconnect structure may be formed from the structure provided in steps (a)–(g) by utilizing conventional processing steps that are well known in the art. Additionally, in one embodiment of the present invention, process steps (a)–(g) are repeated any number of times to provide an interconnect structure in which each successive interconnect level includes a patterned anti-fuse dielectric layer formed thereon.

In another embodiment of the present invention, metal reactive-ion etching is employed in fabricating a multilevel interconnect structure in which the uppermost wiring level contains patterned conductive regions wherein the contact to the lower metal region is through a tapered contact.

The vias formed in the present invention may be slot vias which consists of an enlarged contact via that provides increased in overlay tolerance with the next contact via; stacked vias in which the contact is formed slightly skewed from the previous via or wire level; standard vias in which the contact is formed over the previous via or wiring level; or any combinations thereof.

The present invention also provides interconnect structures in which a patterned anti-fuse material containing an opening to a first level of electrically features is formed on the surface of a substrate. Specifically, the interconnect structure of the present invention comprises:

- a substrate having a first level of electrically conductive features;
- a patterned anti-fuse dielectric formed on said substrate, wherein said patterned anti-fuse dielectric includes an opening to at least one of said first level of electrically conductive features;
- a patterned interlevel dielectric material formed on said patterned anti-fuse dielectric, wherein said patterned interlevel dielectric includes vias, as least one of said vias has a via space formed above said opening; and
- a second level of electrically conductive features formed in said via spaces, wherein said patterned anti-fuse dielectric acts as an insulator layer over covered areas of said first level of electrically conductive features.

DETAILED DESCRIPTION OF THE INVENTION

Figure 1:
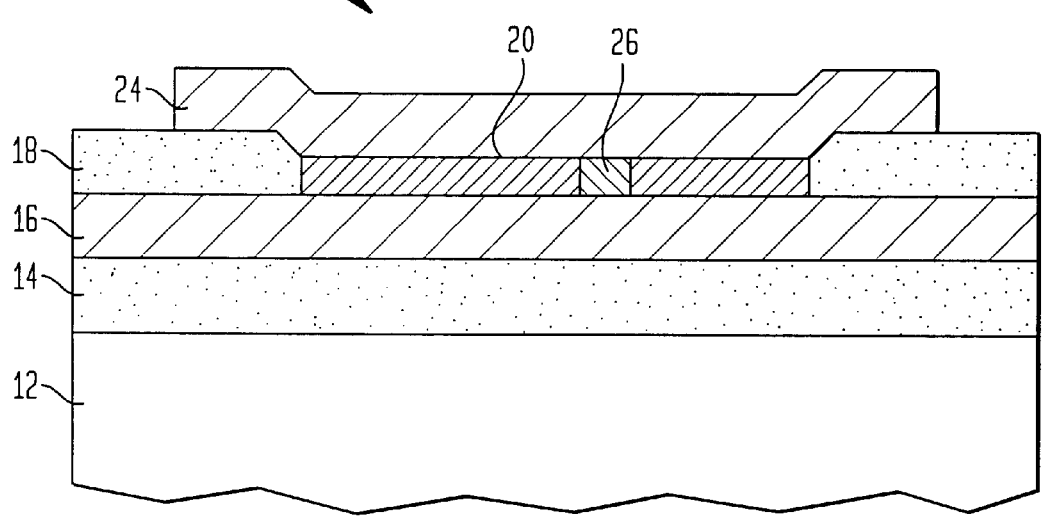
FIG. 1 is a cross-sectional view of a prior art anti-fuse structure.

The present invention which provides a method of fabricating interconnect structures containing an anti-fuse material and interconnect structures containing the same will now be described in more detail by referring to the drawings that accompany the present application. It is noted that in the accompanying drawings like reference numerals are used for describing like and corresponding elements.

Reference is first made to FIGS. 2a–2f which illustrate the basic processing steps that are employed in the present invention. It is emphasized that the structures shown in the drawings of the present invention illustrates basic interconnect structures that can be formed. Other structures in which a connection between two different conductive levels is required are also contemplated in the present invention. Illustrative examples of other structures in which the method of the present invention can be employed include, but are not limited to: first level conductive feature may be a patterned silicon substrate.

Figure 2A:
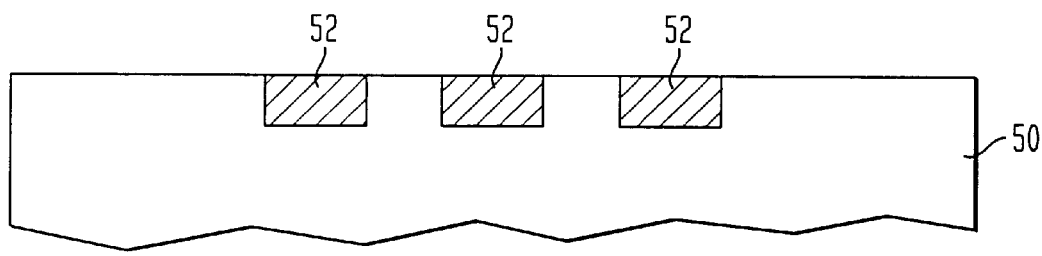
FIGS. 2a–2f are cross-sectional views depicting the various processing steps employed in the present invention.

In FIG. 2a, there is shown the initial structure of the present invention which includes a substrate 50 having a first level of electrically conductive features 52 formed in the substrate (in one embodiment of the invention conductive features are formed on the substrate). Substrate 50 is one of the interlevel dielectric layers of an interconnect structure. The substrate, i.e., interlevel dielectric layer, is composed of any conventional inorganic or organic dielectric material. Suitable organic dielectrics include, but are not limited to: polyimides, polyamides, paralyene, polymethylmethacrylate and other like organic, dielectrics. If an inorganic dielectric is employed, it may be composed of $SiO_2$, $Si_3N_4$, diamond, diamond-like carbon, fluorinated doped oxides or other like-materials.

The first level of electrically conductive features may be formed on the surface of the substrate utilizing conventional deposition processes such as chemical vapor deposition (CVD), plasma-assisted CVD, sputtering, plating, evaporation and like deposition processes and then the deposited metal layer may be patterned by conventional lithography and etching (reactive-ion etching (RIE)). Alternatively when the first level of electrically conductive features is formed in a portion of the substrate, a conventional single or dual damascene process may be employed. suitable materials used in forming the first level of electrically conductive features in the substrate comprise any conventional conductive metal including, but not limited to: aluminum (Al), tungsten (W), copper (Cu), chromium (Cr), gold (Au), platinum (Pt), palladium (Pd) and alloys, mixtures and complexes thereof.

Figure 2B:
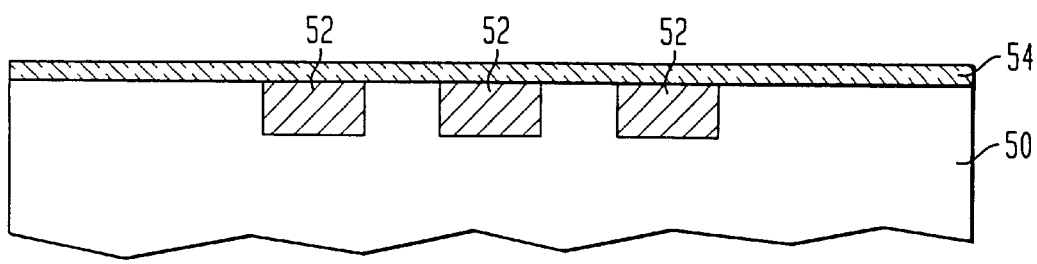

Next, as shown in FIG. 2b, an anti-fuse dielectric layer 54 is formed on the surface of substrate 50 including the first level of electrically conductive features. The anti-fuse layer is formed on the structure utilizing any conventional deposition process. Suitable deposition processes include, but are not limited to: CVD, plasma-assisted CVD, sputtering, evaporation and other like deposition processes. The thickness of the anti-fuse dielectric layer is selected based on the dielectric breakdown properties of the anti-fuse layers. A typical thickness range for the anti-fuse dielectric is from about 2 to about 200 nm, with a range from about 5 to about 10 nm being preferred.

The term "anti-fuse dielectric" is used herein to denote any thin film dielectric which can function in the capacity mentioned in the background section of this application, i.e., as an anti-fuse. Suitable anti-fuse materials that can be employed in the present invention include, but are not limited to: $SiO_2$, $Si_3N_4$, Si oxynitrides, amorphous Si, amorphous C, H-containing dielectrics, carbon, germanium, selenium, compound semiconductors such as GaAs, SiC, AlP, InSb and CdTe, ceramics and other like anti-fuse materials. The present invention also contemplates the use of anti-reflective coatings such as silicon oxynitride as a possible anti-fuse dielectric material. Of these anti-fuse materials, silicon oxynitride is particularly preferred in the present invention.

Figure 2C:
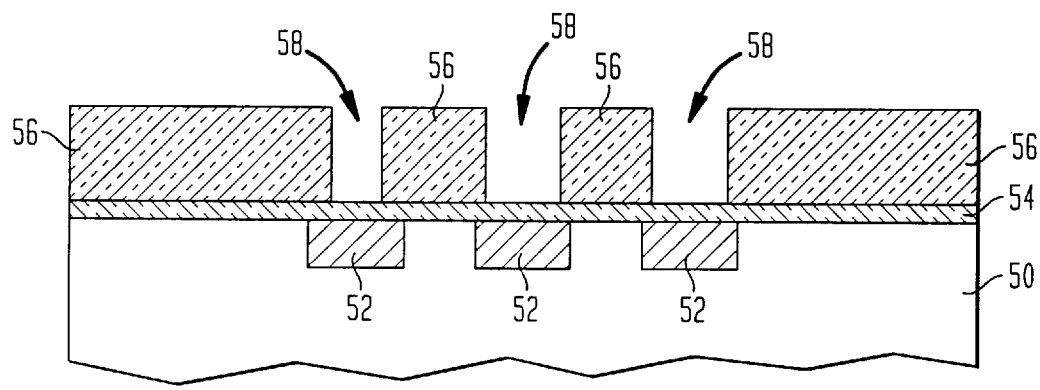

In accordance with the next step of the present invention, and as is shown in FIG. 2c, an interlevel dielectric material 56 is formed on anti-fuse dielectric layer 54 utilizing conventional deposition processes well known to those skilled in the art. This includes CVD, plasma-assisted CVD, sputtering, plating, evaporation and other like deposition processes. An optional planarization process such as chemical-mechanical polishing (CMP) or grinding may follow the deposition of the interlevel dielectric material.

Interlevel dielectric material 56 may be composed of the same or different dielectric material as may be present in the substrate. The thickness of interlevel dielectric material layer 56 is selected to accommodate the formation of a damascened wire and via. Typically, however, interlevel dielectric layer 56 has a thickness of from about 0.1 to about 2.0 $\mu$m.

Following deposition of interlevel dielectric 56, at least one via 58 is formed in interlevel dielectric 56 to expose portions of anti-fuse material layer 54 that overlay first level of electrically conductive features 52. The vias formed in the present invention may be stacked vias, standard vias, slot vias or any combinations thereof. A structure containing standard vias is shown in FIG. 2c.

In the case of a stacked via, the subsequent interconnect via level will connect directly to the stacked via without an intermediate wiring level. In the case of a slot via, the via pattern itself may be elongated to provide interconnection within the level of the via. In the case of a standard via, the via will interconnect between a lower wire level and an upper wire level.

The vias are formed in the present invention utilizing conventional lithography and etching such as RIE. As known to one skilled in the art, the lithography process includes application of a photoresist, patterning the photoresist and developing the pattern. The photoresist is then removed from the structure utilizing conventional stripping processes well known to those skilled in the art.

Figure 2D:
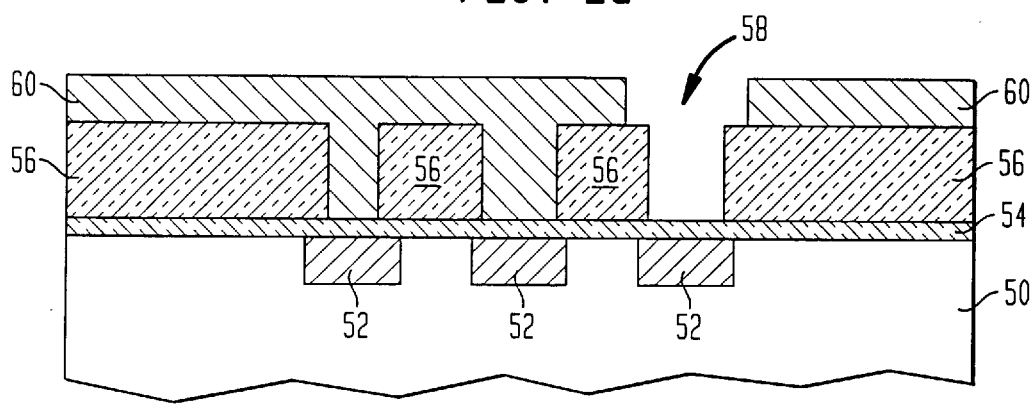
Figure 2E:
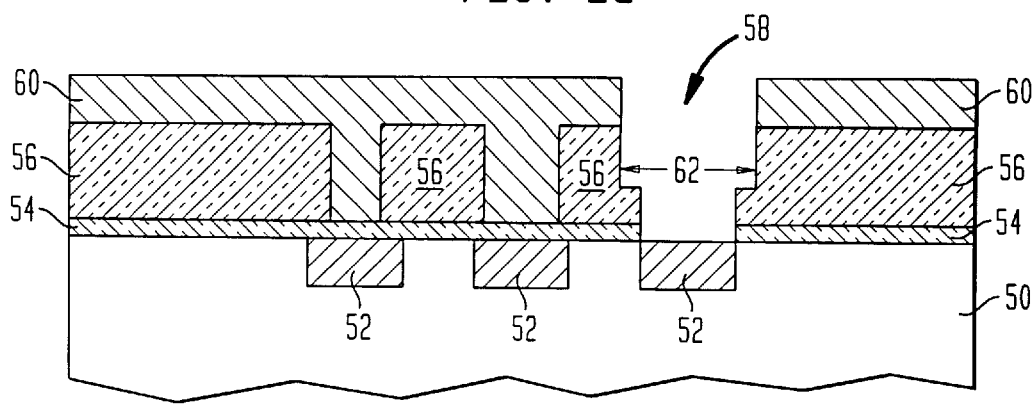
Figure 2F:
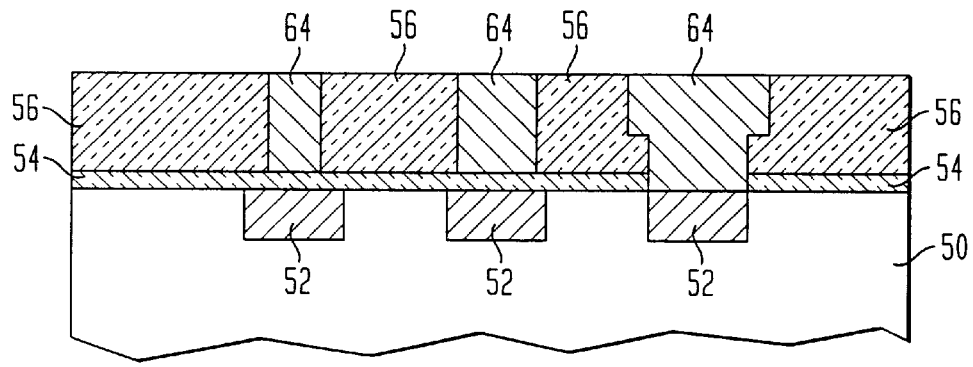

A patterned wire level mask 60 is formed on the structure utilizing conventional processes well known in the art leaving a least one via and a portion of the interlevel dielectric layer about said via exposed. This step of the present invention is shown in FIG. 2d. The wire level mask employed in the present invention includes any conventional mask material that is well known in the art. Since the material of the wire level mask and the processes used in forming the wire level mask are well known to those skilled in the art, a detailed description of the same is not provided herein.

Anti-fuse material in the bottom of the at least one exposed via is then removed utilizing a conventional dry etch process. This step of the present invention is in FIG. 2e. Suitable dry etching processes that can be used in removing the anti-fuse material from the bottom of the exposed via include, but are not limited to: reactive-ion etching (RIE), plasma etching or ion-beam etching. It is also noted that during this etching step a portion of the exposed interlevel dielectric material layer is removed so as to provide a space 62 wherein a second level of electrically conductive features, i.e., wire, may be formed.

Wire level mask 60 is then removed utilizing conventional stripping processes well known to those skilled in the art, and the vias including spaces 62 are then filled with a suitable conductive material 64 utilizing conventional deposition processes such as CVD, plasma-assisted CVD, sputtering and other like processes. After filling the vias and spaces with the conductive material, the structure may be optionally planarized utilizing conventional planarization techniques, i.e., chemical-mechanical polishing (CMP).

The conductive material used to fill vias and the spaces in the interlevel dielectric includes any of the previous mentioned conductive metals used in forming the first level of conductive features. It is noted that the filling step of the present invention forms the second level of conductive features in the spaces formed in the structure, See FIG. 2f.

Optionally, a conductive barrier layer comprising a conventional barrier material such as TiN or Ta is formed in the vias and spaces prior to the above filling process utilizing conventional deposition processes that are well known to those skilled in the art, e.g., CVD, sputtering and evaporation. The optional embodiment is not shown in the figures of the present invention.

Figure 3:
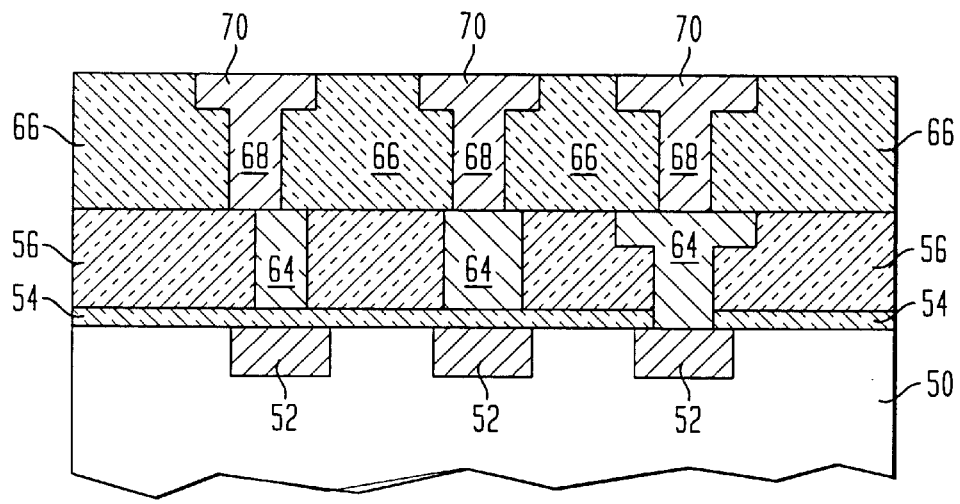
FIG. 3 is a cross-sectional view depicting a multilevel interconnect structure that can be formed utilizing the inventive process.

A multilevel interconnect structure can be formed as shown in FIG. 3. The multilevel structure includes the structure shown in FIG. 2f, as well as a second interlevel dielectric layer 66 and conductively filled vias 68 and electronically conductive features 70. Vias 68 may be stacked vias, slot vias, standard vias or any combinations thereof. In FIG. 3, all three types of vias are shown.

The multilevel interconnect structure is formed utilizing conventional processes that are well known to those skilled in the art. For example, the second interlevel is formed utilizing one of the deposition processing mentioned hereinabove in forming interlevel dielectric layer 56, the vias are formed by lithography and etching, and the vias are filled utilizing any of the deposition processes used previously in filling the vias and spaces.

Alternatively, the processing steps of the present invention may be repeated any number of times to create an interconnect structure in which each successive level includes a patterned anti-fuse material formed thereon.

Figure 4:
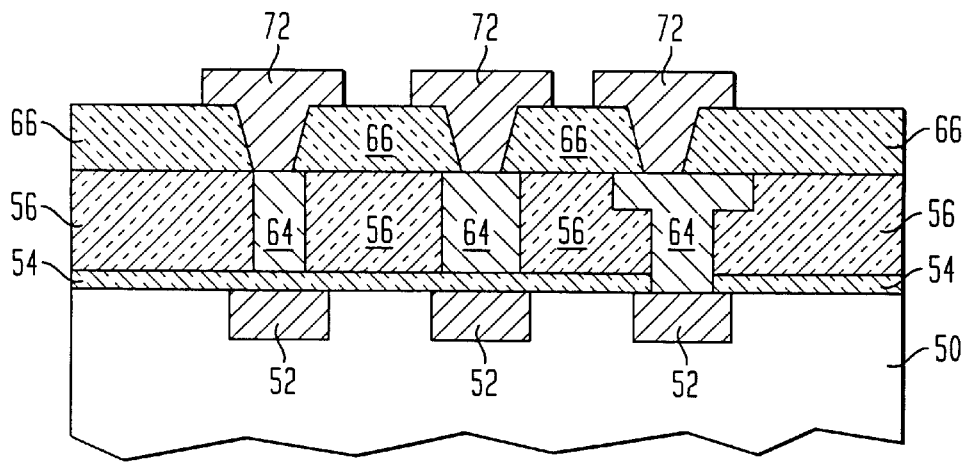
FIG. 4 is a cross-sectional view depicting an alternative interconnect structure that can be formed utilizing the inventive process and a metal RIE processing step.

FIG. 4 illustrates an alternative structure that can be formed utilizing the processing steps of the present invention and a metal RIE process. Specifically, the structure shown in FIG. 4 is formed by first conducting steps (a)–(g) of the present invention and, then forming a second interlevel dielectric layer 66 over the first level interlevel dielectric layer 56. The second interlevel dielectric layer may be composed of the same or different dielectric material as the first interlevel dielectric layer. In FIG. 4, both interlevel dielectric layers are formed of the same dielectric material. An etching process that is capable of forming a tapered opening in the second interlevel dielectric is then utilized. A conductive metal such as mentioned above is formed in the tapered opening and the conductive metal is patterned to provide the structure shown in FIG. 4. Reference numeral 72 denotes patterned conductive metal regions wherein contact to the underlaying metal features is made through a tapered opening.

Figure 5:
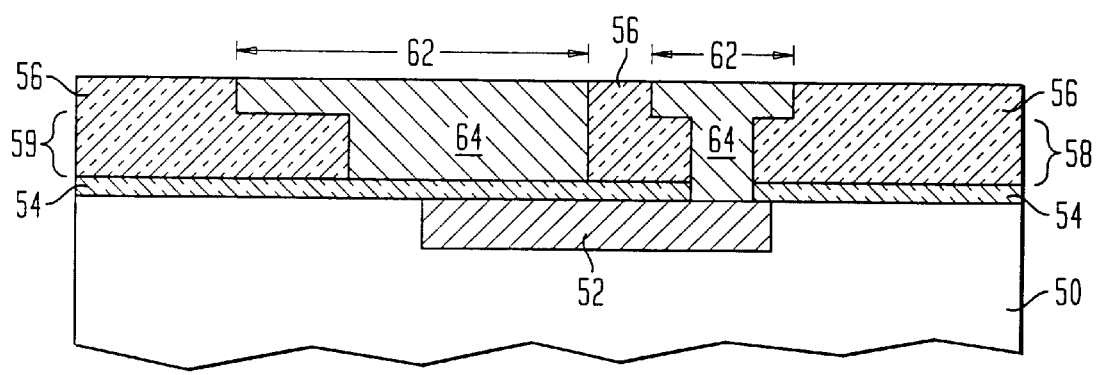
FIG. 5 is a cross-sectional view depicting a 2 wire and slot via dual damascene structure that can be formed in the present invention.

FIG. 5 shows an alternative structure that can be formed in the present invention. Specifically, FIG. 5 illustrates a two wire slot via dual damascene structure comprising substrate 50 having first metal features 52, a patterned anti-fuse dielectric layer 54 is formed on said substrate, a patterned interlevel dielectric layer 56 is formed on said patterned anti-fuse dielectric layer, wherein said patterned interlevel dielectric layer comprises slot via 59, via 58 and spaces 62, said slot via, slot and spaces being filled with a conductive metal 64.

The structure shown in FIG. 5 is fabricated utilizing the same basic processing steps as shown in FIGS. 2a–2f except that interlevel dielectric layer 66 and conductive metal 72 have been omitted. This structure will provide interconnect and anti-fuse function using two pattern mask wire levels and one via mask level. The structure in FIG. 5 utilizes a combination of slot via 59 and standard via 58.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the spirit and scope of the appended claims.

What is claim is:

1. A method of forming an interconnect structure including a patterned anti-fuse dielectric layer formed on surface of a substrate, said method comprising the steps of:
   (a) forming an anti-fuse dielectric layer on a surface of a substrate, said substrate having a first level of electrically conductive features;
   (b) forming an interlevel dielectric layer on said anti-fuse dielectric layer;
   (c) forming vias in said interlevel dielectric layer exposing portions of said anti-fuse dielectric layer that overlay said first level of electrically conductive features;
   (d) forming a wire level mask on said interlevel dielectric layer, wherein at least one of said vias and a portion of said interlevel dielectric layer are left exposed;
   (e) etching exposed portions of said anti-fuse dielectric layer from said exposed vias, wherein during said etching a portion of said exposed interlevel dielectric layer is removed so as to form a space wherein a second level of electrically conductive features will be subsequently formed;
   (f) stripping said wire level mask; and
   (g) filling said vias including said spaces with a conductive material, whereby said second level of electrically conductive features is formed.

2. The method of claim 1 wherein said first level of electrically conductive features is formed by a single or dual damascene process.

3. The method of claim 1 wherein step (a) includes a deposition process selected from the group consisting of CVD, plasma-assisted CVD, sputtering and evaporation.

4. The method of claim 1 wherein said anti-fuse dielectric has a thickness of from about 2 to about 200 nm.

5. The method of claim 4 wherein said anti-fuse dielectric has a thickness of from about 5 to about 10 nm.

6. The method of claim 1 wherein said anti-fuse dielectric is a dielectric material selected from the group consisting of $SiO_2$, $Si_3N_4$, Si oxynitrides, amorphous Si, amorphous C, H-containing dielectrics, carbon, germanium, selenium, compound semiconductors, ceramics and anti-reflective coatings.

7. The method of claim 6 wherein said anti-reflective coating is a silicon oxynitride.

8. The method of claim 1 wherein step (b) includes a deposition process and, optionally, a planarization process.

9. The method of claim 8 wherein said deposition process is selected from the group consisting of chemical vapor deposition (CVD), plasma-assisted CVD, sputtering, plating and evaporation.

10. The method of claim 8 wherein said optional planarization process includes chemical-mechanical polishing (CMP) or grinding.

11. The method of claim 1 wherein said interlevel dielectric has a thickness of from about 0.1 about 2.0 $\mu$m.

12. The method of claim 1 wherein step (c) includes lithography and etching.

13. The method of claim 1 wherein step (e) includes reactive-ion etching, ion-beam etching or plasma etching.

14. The method of claim 1 wherein step (g) includes a deposition process.

15. The method of claim 14 wherein said deposition process is selected from the group consisting of chemical vapor deposition (CVD), plasma-assisted CVD, sputtering, plating and evaporation.

16. The method of claim 1 further comprising a planarizing step after step (g).

17. The method of claim 1 wherein between steps (f) and (g) a barrier layer is applied in said vias and spaces.

18. The method of claim 1 wherein said vias are slot vias, stacked vias, standard vias or any combinations thereof.

19. The method of claim 1 further comprising forming additional interconnect levels to said filled structure provided in step (g).

20. The method of claim 1 further comprising repeating steps (a)–(g) any number of times to provide a multilevel interconnection structure wherein each successive level includes a patterned anti-fuse material formed thereon.

21. The method of claim 1 further comprising forming a second interlevel dielectric layer on the structure provided in step (g), forming a tapered opening in said second interlevel dielectric level exposing the filled conductive vias and spaces; forming a second conductive material in said tapered opening; and reactive-ion etching said second conductive material.

* * * * *